US008421237B2

(12) United States Patent
Chia et al.

(10) Patent No.: US 8,421,237 B2
(45) Date of Patent: Apr. 16, 2013

(54) STACKED MEMORY LAYERS HAVING MULTIPLE ORIENTATIONS AND THROUGH-LAYER INTERCONNECTS

(75) Inventors: Pierre Chor-Fung Chia, Fremont, CA (US); Li Li, San Ramon, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 13/178,262

(22) Filed: Jul. 7, 2011

(65) Prior Publication Data

US 2013/0009318 A1   Jan. 10, 2013

(51) Int. Cl.
*H01L 23/48* (2006.01)
(52) U.S. Cl.
USPC .......................................... 257/774; 438/637
(58) Field of Classification Search ............... 438/637, 438/618; 257/774, 773, 737, 314, 296, 390, 257/E27.84, E27.98
See application file for complete search history.

(56) References Cited

U.S. PATENT DOCUMENTS

| | | | | |
|---|---|---|---|---|
| 6,489,670 B1* | 12/2002 | Peterson et al. | ............... | 257/686 |
| 6,753,611 B1* | 6/2004 | Maeno et al. | ............... | 257/774 |
| 7,105,374 B1* | 9/2006 | Leonard et al. | ............... | 438/82 |
| 7,528,491 B2* | 5/2009 | Kirby et al. | ............... | 257/774 |
| 2009/0302478 A1* | 12/2009 | Pagaila et al. | ............... | 257/774 |
| 2011/0180919 A1* | 7/2011 | Jensen et al. | ............... | 257/690 |
| 2012/0201068 A1* | 8/2012 | Ware | ............... | 365/63 |

OTHER PUBLICATIONS

John H. Lau, "TSV Manufacturing Yield and hidden Costs for 3D IC Integration", 2010 Electronic Components and Technology Conference, 2010, pp. 1031-1042.

"3D Chip Stack with Through-Silicon Vias (TSVS): Identifying, Evaluating and Understanding Reliability Interactions", JEDEC Publication No. 158, Nov. 2009, pp. 1-16.

"TwinDie™ DDR3 SDRAM MT41J1G4—64 Meg × 4 × 8 Banks × 2 Ranks, MT41J512M8—32 Meg ×8 ×8 Banks × 2 Ranks", 4Gb: ×4, ×8 TwinDie DDR3 SDRAM, 2008 Micron Technology, Inc., 2008, pp. 1-14.

* cited by examiner

*Primary Examiner* — Thao P. Le
(74) *Attorney, Agent, or Firm* — Brinks, Hofer, Gilson & Lione (57) ABSTRACT

In one embodiment, an apparatus includes a first memory layer oriented in a first planar orientation, a second memory layer oriented in a second planar orientation, a third memory layer oriented in the first planar orientation; and a connector that is connected to the first memory layer at an electrical contact of the first memory layer and to the third memory layer at an electrical contact of the third memory layer, where the connector is unconnected to the second memory layer. At least one of the electrical contact of the first memory layer and the electrical contact of the third memory layer comprises a through-layer via. The second planar orientation is angularly offset a predetermined number of degrees from the first planar orientation.

20 Claims, 4 Drawing Sheets

STACKED MEMORY LAYERS HAVING MULTIPLE ORIENTATIONS AND THROUGH-LAYER INTERCONNECTS

TECHNICAL FIELD

The present disclosure relates generally to memory devices and, more particularly, to stacked memory devices having multiple orientations.

BACKGROUND

Increasing the amount of memory in an electronic device may improve the performance of the electronic device. As examples, the electronic device may process files or software programs faster, may run more software programs simultaneously, may process large data such as audio or video data faster, may process and/or display web data such as webpage animations or audio streams faster, or may network with other electronic devices more efficiently. To increase the memory capacity of a single layer of memory, more individual memory elements may be used. However, the size of the memory layer may be limited. Reducing the size of the individual memory elements may allow for more individual memory elements to be included on the memory layer without increasing the size of the layer. However, the minimum size of individual memory elements is not infinitesimal. Also, memory having individual memory elements that are too small may generate too much heat. Alternatively or in addition to adding more individual memory elements on a single layer, multiple memory layers stacked above one another may be used.

DETAILED DESCRIPTION

Overview

An apparatus includes a first memory layer oriented in a first planar orientation, a second memory layer oriented in a second planar orientation, a third memory layer oriented in the first planar orientation; and a connector that is connected to the first memory layer at an electrical contact of the first memory layer and to the third memory layer at an electrical contact of the third memory layer, where the connector is unconnected to the second memory layer. At least one of the electrical contact of the first memory layer and the electrical contact of the third memory layer comprises a through-layer via. The second planar orientation is angularly offset a predetermined number of degrees from the first planar orientation.

Description of Example Embodiments

The present disclosure describes a memory chip comprising stacked layers of memory that are oriented in multiple planar orientations. Stacked layers of memory may include a plurality of memory layers having planar surfaces that face each other. Stacked layers of memory may be referred to as being three-dimensionally-stacked or vertically-stacked layers. In a vertical stack of memory layers, the planar surfaces may be referred to as facing "up" and/or "down" and the memory layers may be referred to as being disposed "above" and/or "below" each other. However, the terms "vertically-stacked," "up," "down," "above," and/or "below" are not intended as limiting the orientation of the memory chip, the stack of the memory layers in the chip, and/or the orientations of the individual memory layers. The memory chip and/or the stack of the memory layers may be oriented in any direction. Similarly, the planar surfaces of the memory layers may face in any direction. Each memory layer may have two opposing planar surfaces that face in opposite directions. The opposing planar surfaces may be a top surface and a bottom surface. The top and bottom surfaces may face in any direction, where the direction that the top surface faces is opposite or substantially opposite the direction that the bottom surface faces. As an example, the top surface may be referred to as facing "up" and the bottom surface may be referred to as facing "down." In addition, a memory layer that is "above" one or more other memory layers may be a memory layer that has a bottom surface that faces or substantially faces the top surfaces of the other memory layers, regardless of the directions in which the top and bottom surfaces face. Similarly, a memory layer that is "below" one or more other memory layers may be a memory layer that as a top surface that faces or substantially faces the bottom surfaces of the other memory layers, regardless of the directions in which the top and bottom surfaces face. In addition or alternatively, two memory layers may be referred to as being adjacent memory layers if there are no memory layers disposed in between them.

The memory layers may be disposed above or below each other in planes. The planes may be determined based on one or more opposing planar surfaces of the memory layers. Each memory layer may be oriented in a plane in one of at least two planar orientations. The memory layers oriented in a first planar orientation may comprise a first set of a stack of memory layers. The memory layers oriented in a second planar orientation may comprise a second set of the stack of memory layers. The planar orientations may be determined based on opposing ends of the memory layer. The planar orientations of different memory layers may be angularly offset a predetermined number of degrees from each other.

The memory layers that are oriented in a common planar orientation may be in electrical communication with each other. The memory chip may include interconnects to communicate between the memory layers having the same or substantially the same planar orientation. Two or more memory layers may be considered to have the same or substantially the same planar orientation if their respective ends are aligned with each other. An interconnect may comprise electrical contacts disposed on or in the memory layers and one or more connectors disposed in between the electrical contacts. The electrical contacts may comprise vias, including through-layer vias such as through-silicon-vias (TSV). A single via may be disposed completely or partially through a memory layer. Alternatively or in addition, the electrical contacts may comprise pads, traces, or other electrically conductive materials disposed on the top surface or the bottom surface of the memory layers. A connector may be an electrically conductive material, such as a solder bump, that may be disposed in between the memory layers and be electrically connected to the electrical contacts. The connector may also be physically connected to the memory layers directly above and/or directly below the connector. For example, where the connector comprises a solder bump, the solder bump may be connected to an electrical contact of the memory layer directly above the connector and/or be connected to an electrical contact of the memory layer directly below the connector, such as by solder. Herein, the phrase "connected with" or "connected to" is defined to mean directly connected to or indirectly connected through one or more intermediate components/conductive materials, unless otherwise specifically described. In addition, although the terms "above" and "below" are used to describe the relative position of different memory layers and connectors in the embodiments, these terms should not be construed as limiting the relative positioning of the memory layers and connectors, since the memory layers as a group can be in any orientation resulting in substantially parallel positioning between adjacently located memory layers.

The interconnect may comprise an electrical connection for two memory layers. For example, the interconnect may comprise a connector disposed in between two memory layers, an electrical contact disposed in or on the memory layer directly above the connector, and an electrical contract disposed in or on the memory layer directly below the connector. The connector is electrically connected to and may be physically connected to the electrical contact disposed in the memory layer directly above the connector. In addition, the connector is electrically connected to and may be physically connected to an electrical contact disposed in the memory layer directly below the connector. A plurality of interconnects that may be electrically and physically connected to each other may comprise an interconnect channel. For example, the interconnect channel may include a first interconnect that is connected to a second interconnect. The first interconnect may comprise a first connector disposed in between a first layer and a second layer that is connected to an electrical contact disposed in or on the first layer, and connected to an electrical contact disposed in or on the second layer. The second interconnect may comprise a second connector disposed in between the second layer and a third layer. The second connector may be connected to an electrical contact disposed in or on the second layer and may be connected to an electrical contact disposed in or on the third layer.

Alternatively, the interconnect may comprise an electrical connection between an end memory layer (e.g., a bottom layer or a top layer of the plurality of memory layers), and a base substrate or interface chip. For example, the interconnect may comprise a connector disposed in between the end memory layer and the base substrate or the interface chip. The connector may be connected to an electrical contact disposed in or on the end memory layer and may be connected to an electrical contact disposed in or on the base substrate or interface chip.

The interconnects may communicate signals to and/or from elements disposed in or on the memory layers. The elements may comprise individual storage elements or individual memory elements such as flip flops or latches that are configured to store one or more bits of storage information. The storage elements may be configured in an array or a grid on the top surface and/or the bottom surface of the memory layer. The array of storage elements may comprise volatile memory such as static random-access memory (SRAM), dynamic random-access memory (DRAM), zero-capacitor random-access memory (Z-RAM), twin transistor random-access memory (TTRAM), or advanced-random access memory (A-RAM). Alternatively or in addition, the array of storage elements may comprise non-volatile memory such as read-only memory (ROM), programmable read-only memory (PROM), field programmable read-only memory (FRPROM), one-time programmable non-volatile memory (OTP NVM), erasable programmable read-only memory (EPROM), electrically erasable programmable read-only memory (EEPROM), nano-RAM, millipede, flash memory, ferroelectric RAM (FeRAM), programmable metallization cell (PMC) memory, parallel random access machine (PRAM) memory, silicon-oxide-nitride-oxide-silicon (SONOS) memory, resistive random-access memory (RRAM), or racetrack memory. Other types of volatile or non-volatile memory may be used.

The interconnects may communicate input/output (I/O) signals such as data I/O signals comprising data that is to be written to or read from the storage elements or other I/O signals such as data strobe signals. Alternatively or in addition, the interconnects may communicate input signals such as address input signals comprising addresses of the storage elements for which the data is to be written to or read from output signals, bank address input signals, clock signals, clock enable signals, chip select signals, input data mask signals, on-die termination signals, command inputs, and/or reset signals. Alternatively or in addition, the interconnects may communicate output signals such as termination data strobe signals. Alternatively or in addition, the interconnects may communicate supply signals such as power supply signals, data (DQ) power supply signals, reference voltage for control, command, and/or address signals, reference voltage for data signals, ground signals, and/or DQ ground signals. Alternatively or in addition, the interconnects may communicate reference signals such as external reference ball signals for output drive calibration. Other types of signals may be communicated. The memory layers for which the input and/or output signals are communicated to and from may be selected using eFUSE or a plurality of eFUSEs, which may allow for dynamic real-time programming of the memory chip.

The memory chip may comprise a plurality of memory layers that are all oriented in the same planar orientation. Where the memory layers are all oriented in the same or substantially the same planar orientation, the number of interconnects that comprise an interconnect channel may be equal to the number of memory layers in the stack in order for the interconnect channel to communicate a signal to each of the layers. The number of interconnects that comprise the interconnect channel may be equal to the number of memory layers in the stack regardless of whether the interconnect channel is communicating a signal to a layer that is below the top-most layer. For example, a memory chip comprising four vertically-stacked memory layers may comprise an interconnect channel comprising four interconnects, a first interconnect connecting the base substrate with the first layer, a second interconnect connecting the first layer and the second layer, a third interconnect connecting the second layer and the third layer, and a fourth interconnect connecting the third layer and the fourth layer. The interconnect channel may comprise four interconnects even though the interconnect channel may not be configured to communicate signals to the fourth layer. For example, an interconnect channel configured to communicate signals to the first layer, but not the second, third, or fourth layers, may still comprise four interconnects. In addition, where the interconnects comprise solder bumps and TSVs, each interconnect channel may comprise a number of solder bumps and a number of TSVs equal to or greater than to the number of memory layers in the stack. For the four layer memory stack example, the interconnect channel may comprise four solder bumps and four TSVs. A first solder bump may be disposed in between the base substrate (or interface chip) and the first layer, a second solder bump may be disposed in between the first layer and the second layer, a third solder bump may be disposed in between the second layer and the third layer, and a fourth solder bump may be disposed in between the third layer and the fourth layer. Similarly, a first TSV may be disposed in the first layer, a second TSV may be disposed in the second layer, a third TSV may be disposed in the third layer, and a fourth TSV may be disposed in the fourth layer.

Orienting the stack of memory layers, such as a three-dimensional stack or a vertical stack of memory layers, to have at least two different planar orientations may reduce the number of solder bumps and/or contacts that comprise an interconnect channel. As an example, for an even number of memory layers, where half of the memory layers are oriented in a first planar orientation and half are oriented in a second planar orientation, the number of solder bumps and/or TSVs may be reduced by half compared to a stack having the same number of layers where all of the layers have the same planar orientation. Using the example of the four layer memory stack above, if the first and third layers are oriented in a first planar orientation and the second and fourth layers are oriented in a second orientation, a first interconnect channel that communicates a signal, e.g., a data I/O signal, to the first layer may comprise two solder bumps and two TSVs, i.e., a first solder bump in between the base substrate and the first layer, a first TSV extending through the first layer, a second solder bump in between the first layer and the third layer, and a second TSV extending through the third layer. Likewise, a second interconnect channel that communicates a signal, e.g., a data I/O signal, to the second layer may comprise two solder bumps and two TSVs, i.e., a first solder bump in between the base substrate and the second layer, a first TSV extending through the second layer, a second solder bump in between the second layer and the fourth layer, and a second TSV extending through the fourth layer. Similarly, a third interconnect channel that communicates a signal, e.g., a data I/O signal, to the third layer may comprise two solder bumps and two TSVs, i.e., a first solder bump in between the first layer and the third layer, a first TSV extending through the first layer, a second solder bump in between the first layer and the third layer, and a second TSV extending through the third layer. Likewise, a fourth interconnect channel that communicates a signal, e.g., a data I/O signal, to the second layer may comprise two solder bumps and two TSVs, i.e., a first solder bump in between the base substrate and the second layer, a first TSV extending through the second layer, a second solder bump in between the second layer and the fourth layer, and a second TSV extending through the fourth layer.

Table 1 compares the number of solder bumps and TSVs that comprise the four interconnect channels for the examples of the four layer memory stacks described above.

TABLE 1

| # of planar orientations | # of interconnect channels | # of solder bumps | # of TSVs |
|---|---|---|---|
| 1 | 4 | 16 | 16 |
| 2 | 4 | 8 | 8 |

As Table 1 shows, for four memory layers where two of the layers are oriented in a first planar orientation and the other two of the layers are oriented in a second planar orientation, the number of solder bumps and TSV are reduced in half as compared to when the stack has only one planar orientation. In general, where there is an even number of memory layers and half of the memory layers are oriented in one planar orientation and the other half of the memory layers are oriented in a different planar orientation, the number of solder bumps and TSV may be reduced in half as compared to the number of solder bumps and the number of TSVs used for a memory stack where all of the memory layers are oriented in the same planar orientation. Otherwise stated, the memory capacity (e.g., the number of memory layers) may be doubled while maintaining the same number of solder bumps and/or TSVs when the memory layers are oriented in two different planar orientations as compared to when the memory layers are oriented in only one planar orientation.

In an alternative memory stack having an equal number of memory layers, where the number of memory layers oriented in one planar orientation and the number of memory layers oriented in another planar orientation are not equally divided (e.g., three memory layers are oriented in a first planar orientation and one memory layer is oriented in a second planar orientation), the number of solder bumps and/or TSVs may be reduced as compared to the number of solder bumps and/or TSVs in a memory stack where all of the memory layers are oriented in the same planar orientation. However, the number of reduced TSVs and/or solder bumps may be an amount that is less than half. Similarly, in an alternative memory stack having an odd number of memory layers, where the number of memory layers oriented in one planar orientation and the number of memory layers oriented in another planar orientation are not equal, the number of solder bumps and/or TSVs may be reduced as compared to the number of solder bumps and/or TSVs in a memory stack where all of the memory layers are oriented in the same planar orientation. However, that number be reduced by an amount less than half.

Reducing the number of solder bumps and/or TSVs may simplify the manufacturing of stacked memory chips and/or reduce the cost of manufacturing the stacked memory chips. Alternatively or in addition, reducing the TSVs and/or solder bumps may reduce the capacitance that is generated from the interconnects.

Figure 1:
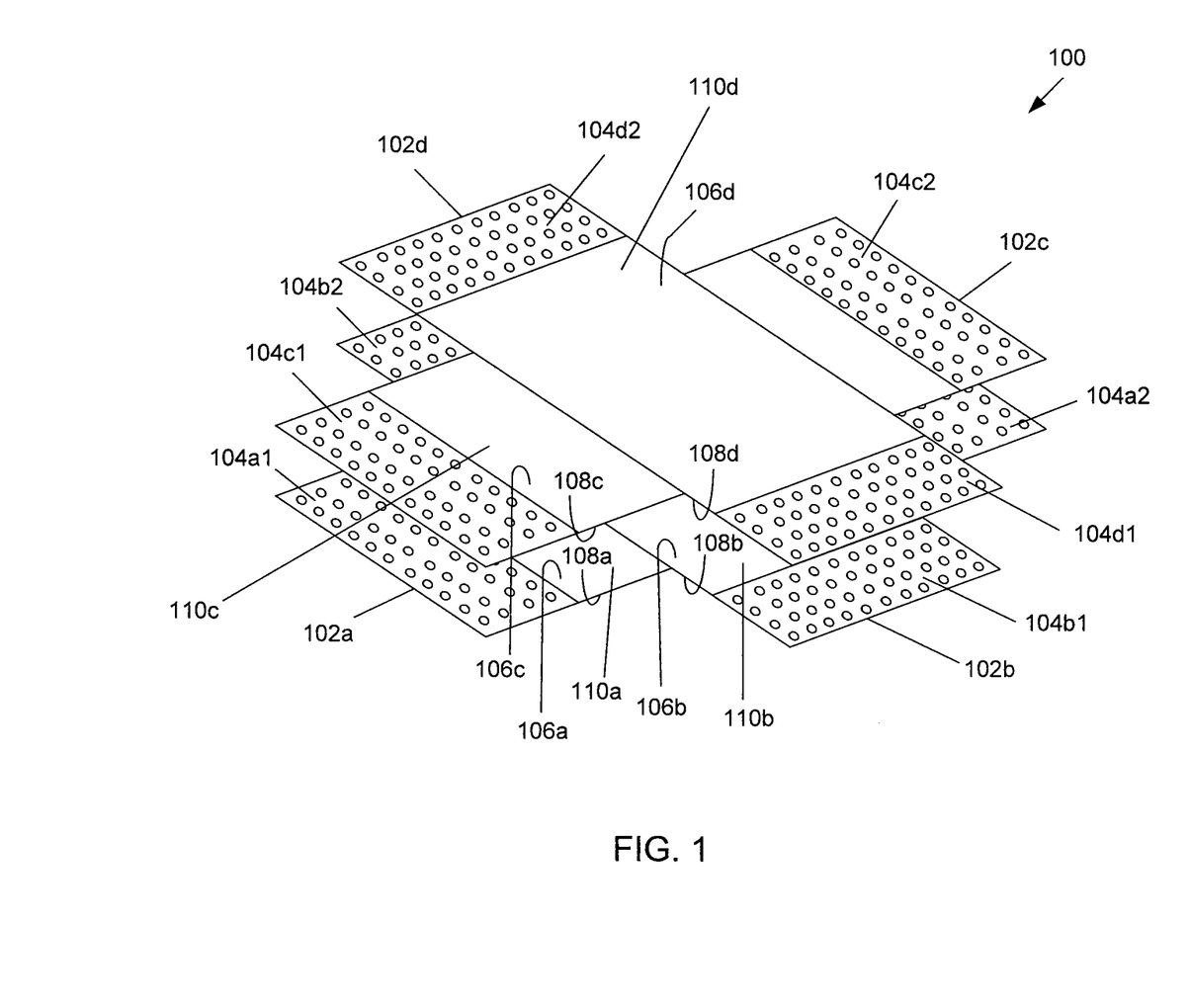
FIG. 1 illustrates an exploded view of an example embodiment of a stack of memory layers.

FIG. 1 illustrates an exploded view of an example stack 100 of memory layers 102 having first and second planar orientations. The stack shown in FIG. 1 comprises four memory layers, a first memory layer 102a, a second memory layer 102b, a third memory layer 102c, and a fourth memory layer 102d. Alternative stacks may include an amount of memory layers other than four and/or an orientation other than vertical. The stack may include at least two memory layers. Each memory layer 102a, 102b, 102c, 102d includes a plurality of contacts 104. As shown FIG. 1, the plurality of contacts 104 may be disposed at end portions of the memory layer that are at or near opposing ends of the memory layers 102. An end portion of the memory layer may be any portion of the memory layer that is closer to the end of the memory layer than to a center position of the memory layer.

The first memory layer 102a may include a plurality of contacts 104a1, 104a2 disposed at opposing end portions of the memory layer 102a. The second memory layer 102b may include a plurality of contacts 104b1, 104b2 disposed at opposing end portions of the memory layer 102b. The third memory layer 102c may include a plurality of contacts 104c1, 104c2 disposed at opposing end portions of the memory layer 102c. The fourth memory layer 102d may include a plurality of contacts 104d1, 104d2 disposed at opposing end portions of the memory layer 102d. Alternative vertical stacks may include other configurations of the contacts 104. For example, the contacts 104 may be disposed at only one end portion of the memory layers 102. As another example, the contacts 104 may be disposed at areas of the memory layers 102 other than the opposing end portions, such as at adjacent end portions or at central portions of the memory layers. Adjacent end portions may be portions of the memory layer that are at or near adjacent sides of the memory layer. A central portion may be a portion of the memory layer that is closer to the center position of the memory layer than the end of the memory layer.

The contacts 104 may be disposed in and/or on the memory layers 102. The contacts 104 may comprise vias, such as through-layer vias (e.g., through-silicon-vias (TSV)). The vias may be disposed completely or partially through the memory layers 102. Alternatively or in addition, the contacts 104 may comprise pads, traces, or other electrically conductive materials disposed on a top surface 106 or a bottom surface 108 of the memory layer 102.

The contacts 104 may be in electrical communication with an array of memory elements 110. For example, for the stack 100 shown in FIG. 1, the contacts 104a1, 104a2 may be in electrical communication with an array of memory elements 110a of the first layer 102a, the contacts 104b1, 104b2 may be in electrical communication with an array of memory elements 110b of the second layer 102b, the contacts 104c1, 104c2 may be in electrical communication with an array of memory elements 110c of the third layer 102c, and the contacts 104d1, 104d2 may be in electrical communication with an array of memory elements 110d of the fourth layer 102d. As shown in FIG. 1, the array of memory elements 110 may be disposed on the top surfaces 106 of the memory layers 102. In alternative stacks, the array of memory elements may be disposed on the top surfaces 106 and/or the bottom surfaces 108. The array of memory elements 110 may comprise volatile memory or non-volatile memory, as previously discussed. In addition, the contacts 104 may be configured to communicate signals to the array of memory elements 110. The signals may comprise input/output (I/O) signals, as previously discussed.

The memory layers 102 may be disposed adjacently in planes. The planes may be parallel or substantially parallel to each other. The planes may be determined by opposed surfaces of a memory layers 102, such as top surfaces 106 or the bottom surfaces 108 of the memory layers 102. Each memory layer 102 may be oriented in its respective plane in one of at least two planar orientations. The planar orientations may be determined or identified by opposing ends of the memory layers 102 and/or opposing end portions of the memory layers 102. For example, the planar orientations may be determined by the opposing end portions of the memory layers 102 that comprise the contacts 104. Two different memory layers 102 may have the same or substantially the same planar orientation if the end portions and/or the contacts 104 for one of the memory layers 102 are aligned or substantially aligned with the end portions and/or the contacts 104 of the other memory layer 102. Similarly, two different memory layers 102 may have different or substantially different planar orientations if the end portions and/or the contacts 104 for one of the memory layers 102 are unaligned or substantially unaligned with the end portions and/or the contacts 104 for the other memory layer 102. As shown in FIG. 1, the memory layers 102 are oriented in two planar orientations. The first memory layer 102a and the third memory layer 102c are oriented in a first planar orientation. The contacts 104a of the first memory layer 102a are aligned or substantially aligned with the contacts 104c of the second memory layer 102c. Also, the contacts 104a and the contacts 104c are unaligned or substantially unaligned with the contacts 104b of the second memory layer 102b and the contacts 104d of the fourth memory layer 104d. Similarly, the second memory layer 102b and the fourth memory layer 102d are oriented in a second planar orientation. The contacts 104b of the second memory layer 102b are aligned or substantially aligned with the contacts 104d of the fourth memory layer 102d. Also, the contacts 104b and the contacts 104d are unaligned or substantially unaligned with the contacts 104a of the first memory layer 102a and the contacts 102c of the third memory layer.

The planar orientations may be angularly offset a number of degrees from each other. The planar orientations may be offset by any amount of degrees provided that the contacts of the memory layers oriented in one planar orientation are not aligned or substantially and are not directly above or directly below the contacts of the memory layers 102 in another planar orientation. For example, as shown in FIG. 1, the first planar orientation and the second planar orientation are offset by about ninety degrees from each other. As shown in FIG. 1, the contacts 104a1, 104a2, 104c1, 104c2 of the first and third memory layers 102a, 102c oriented in the first planar orientation are not aligned with and are not directly above or directly below the contacts 104b1, 104b2, 104d1, 104d2 of the second and fourth layers 102b, 102d oriented in the second planar orientation.

Figure 2:
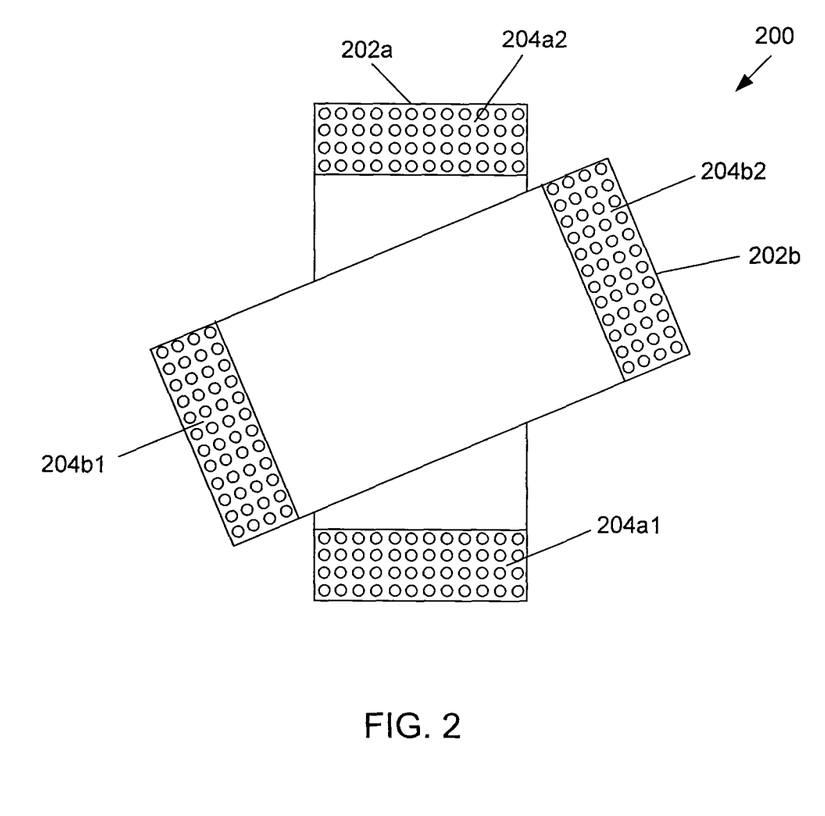
FIG. 2 illustrates a top view of an example embodiment of a stack of memory layers.

In alternative memory stacks, offsets other than ninety-degree offsets may be used. FIG. 2 illustrates a top view of an alternative stack 200 of memory layers 202, showing a first planar orientation that is offset from a second planar orientation by an amount other than ninety degrees. In FIG. 2, a first memory layer 202a is oriented in the first planar orientation and a second memory layer 202b is oriented in the second planar orientation. The first planar orientation is offset from the second orientation by about forty-five degrees. As shown in FIG. 2, the contacts 204a1, 204a2 in the first layer 202a are not aligned and are not directly below the contacts 204b1, 204b2 in the second layer 202b. Although not shown, memory layers other than the first memory layer 202a and the second memory layer 202b may be in the first planar orientation or the second planar orientation. If another memory layer is oriented in the first planar orientation, then that memory layer may have contacts that are aligned or substantially aligned with the contacts 204a1, 204a2 of the first memory layer 202a. Similarly, if another memory layer is oriented in the second planar orientation, then that memory layer may have contacts that are aligned or substantially aligned with the contacts 204b1, 204b2 of the second memory layer 202b.

Figure 3:
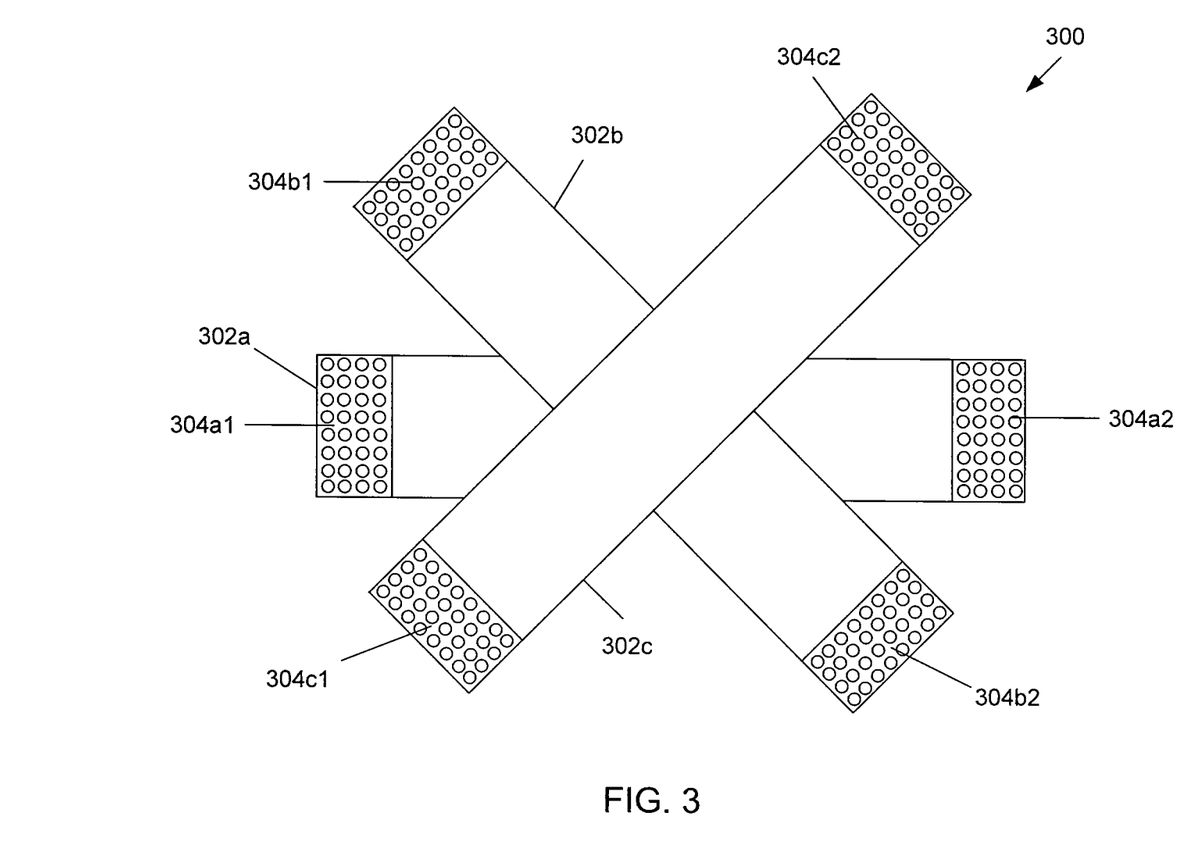
FIG. 3 illustrates a top view of another example embodiment of a stack of memory layers.

In alternative memory stacks, the memory layers may be oriented in more than two planar orientations. FIG. 3 illustrates a top view of an alternative stack 300 of memory layers 302, showing more than two different planar orientations. In FIG. 3, a first memory layer 302a is oriented a first planar orientation, a second memory layer 302b is oriented in a second planar orientation, and a third memory layer 302c is oriented in a third planar orientation. As shown in FIG. 3, contacts 304a1, 304a2 of the first memory layer 302a oriented in the first planar orientation are not directly below contacts 304b1, 304b2 of the second memory layer 302b oriented in the second planar orientation, and also are not directly below contacts 304c1, 304c2 of the third memory layer 302c oriented in the third planar orientation. Similarly, the contacts 304b1, 304b2 of the second memory layer 302b oriented in the second planar orientation are not directly above the contacts 304a1, 304a2 of the first memory layer 302a oriented in the first planar orientation, and also are not directly below contacts 304c1, 304c2 of the third memory layer 302c oriented in the third planar orientation. Similarly, the contacts 304c1, 304c2 of the third memory layer 302c oriented in the third planar orientation are not directly above the contacts 304a1, 304a2 of the first memory layer 302a oriented in the first planar orientation, and are not directly above the contacts 304b1, 304b2 of the second memory layer 302b oriented in the second planar orientation. Although not shown, memory layers other than the first memory layer 302a, the second memory layer 302b, and/or the third memory layer 302c may be in the first planar orientation, the second planar orientation, or the third planar orientation. If another memory layer is oriented in the first planar orientation, then that memory layer may have contacts that are aligned or substantially aligned with the contacts 304a1, 304a2 of the first memory layer 302a. Similarly, if another memory layer is oriented in the second planar orientation, then that memory layer may have contacts that are aligned or substantially aligned with the contacts 304b1, 304b2 of the second memory layer 302b. Likewise, if another memory layer is oriented in the third planar orientation, then that memory layer may have contacts that are aligned or substantially aligned with the contacts 304c1, 304c2.

Figure 4:
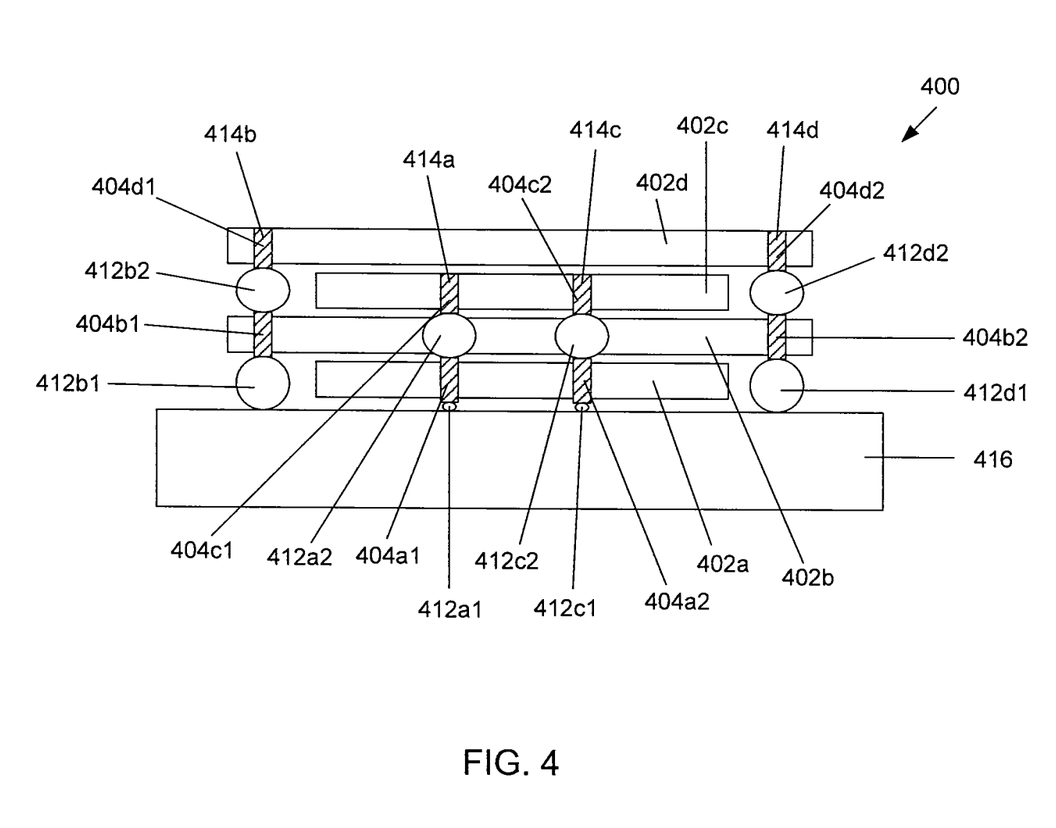
FIG. 4 illustrates a cross-sectional side view of an example embodiment of a stack of memory layers.

FIG. 4 illustrates an example cross-sectional side view of an embodiment of a memory chip 400 that includes a plurality of memory layers 402 oriented in one of two planar orientations. In other examples, any number of memory layers and any number of planar orientations may be illustrated. A first memory layer 402a is oriented in a first planar orientation, a second memory layer 402b is oriented in a second planar orientation, a third memory layer 402c is oriented in the first planar orientation, and a fourth memory layer 402d is oriented in the second planar orientation. FIG. 4 shows the first memory layer 402a having contacts 404a1, 404a2, the second memory layer 402b having contacts 404b1, 404b2, the third memory layer 402c having contacts 404c1, 404c2, and the fourth memory layer 402d having contacts 404d1, 404d2. The contacts 404 may comprise through-layer vias, such as TSVs, extending completely through the memory layers 402.

The contacts 404 may be electrically connected and physically connected to connectors 412. The contact 404a1 may be connected to connector 412a1 and to connector 412a2. The contact 404a2 may be connected to connector 412c1 and connected to connector 412c2. The contact 404b1 may be connected to connector 412b1 and connected to connector 412b2. The contact 404b2 may be connected to connector 412d1 and connected to connector 412d2. The contact 404c1 may be connected to the connector 412a2. The contact 404c2 may be connected to the connector 412c2. The contact 404d1 may be connected to the connector 412b2. The contact 404d2 may be connected to the connector 412d2. The connectors 412 may be an electrically conductive material, such as a solder bump. The connectors 412 may be physically connected to the contacts 404 by being soldered to the contacts 404.

In addition, the connectors in connection with the contacts of memory layers that are oriented in one planar orientation may bypass connection with and/or be unconnected to the memory layers and/or the contacts of memory layers that are oriented in other planar orientations. For example, the connector 412a2 and the connector 412c2 (i.e., the connectors in between the first memory layer 402a and the third memory layer 402c) may bypass connection with and/or be unconnected to contacts 404b1, 404b2 in the second memory layer 402b and the contacts 404d1, 404d2 in the fourth memory layer 402d. The connector 412b2 and the connector 412d2 (i.e., the connectors in between the second memory layer 402b and the fourth memory layer 402d) may bypass connection with and/or be unconnected to the contacts 404a1, 404a2 in the first memory layer 402a and the contacts 404c1, 404c2 in the third memory layer 402c.

Interconnect channels 414 may comprise the contacts 404 and the connectors 412. A first interconnect channel 414a may comprise the connector 412a1, the contact 404a1, the connector 412a2, and the contact 414a. A second interconnect channel 414b may comprise the connector 412b1, the contact 404b1, the connector 412b2, and the contact 404d1. A third interconnect channel 414c may comprise the connector 412c1, the contact 404a2, the connector 412c2, and the contact 404c2. A fourth interconnect channel 414d may comprise the connector 412d1, the contact 404b2, the connector 412d2, and the contact 404d2.

The memory chip 400 may further include a base substrate 416 that is disposed adjacent an end memory layer, such as the first memory layer 402a or the fourth memory layer 402d. For example, in FIG. 4, the base substrate 416 is disposed below the first memory layer 402a (i.e., the bottom surface of the first memory layer 402a faces the base substrate 416). The connector 412a1 and the connector 412c1 (i.e., the connectors in between a base substrate 416 and the first memory layer 402a) may be connected to the first memory layer 402a and to the base substrate 416. In addition, the connector 412a1 and the connector 412c1 may bypass connection with and/or be unconnected to contacts in the second memory layer 402b and the fourth memory layer 402d that are oriented in the second planar orientation, including contacts 404b1, 404b2, 404d1, and/or 404d2. Also, the connector 412b1 and the connector 412d1 (i.e., the connectors in between the base substrate and the second memory layer 402b) may be connected to the second memory layer 402b and to the base substrate 416. In addition, the connector 412b1 and the connector 412d1 may bypass connection with and/or be unconnected to contacts in the first memory layer 402a and the third memory layer 402c that are oriented in the first planar orientation, including contacts 404a1, 404a2, 404c1, and/or 404c2.

The interconnect channels may communicate signals from the base substrate 416 to arrays of memory elements on the layers 402. The first interconnect channel 414a may communicate signals from the base substrate 416 to memory elements of the first layer 402a or memory elements of the third layer 402c. The second interconnect channel 414b may communicate signals from the base substrate 416 to memory elements of the second layer 402b or the fourth layer 402d. The third interconnect channel 414c may communicate signals from the base substrate 416 to memory elements of the first layer 402a or the third layer 402c. The fourth interconnect channel 414d may communicate signals from the base substrate 416 to memory elements of the second layer 402b or the fourth layer 402d. The signals may comprise input/output (I/O) signals as previously discussed. Alternatively or in addition, the interconnects may communicate reference signals such as external reference ball signals for output drive calibration.

The interconnect channels may be associated with one type of signal for one memory layer. For example, one interconnect channel may be used to communicate I/O data to the array of memory for the first layer. FIG. 4 shows four interconnect channels 414a, 414b, 414c, 414d. In alternative memory chips, other amounts of interconnect channels may be included. In one example, the alternative memory chip includes 312 interconnect channels. Each memory layer comprises 78 contacts at opposing ends of the memory layer. Four sets of 78 interconnect channels are disposed at the ends of the memory layers. In another example, the memory chip includes 328 interconnect channels. Each memory layer comprises 82 contacts at opposing ends of the memory layer. Four sets of 82 interconnect channels are disposed at the ends of the memory layers.

The memory layers 402 may be oriented in multiple planar orientations such that at least one of the memory layers 402 is oriented in the first planar orientation and at least a different one of the memory layers 402 is oriented in the second planar orientation. FIG. 4 shows the memory layers 402 being alternatingly oriented in the first and second planar orientations. That is, the first memory layer 402a and the third memory layer 402c are oriented in the first planar orientation and the second memory layer 402b and the fourth memory layer are oriented in the second planar configuration. In an alternative memory chip, the memory layers 402 may be oriented in a configuration other than alternating planar orientations. For example, consecutively stacked memory layers may be oriented in the same or substantially the same planar orientation. Referring to FIG. 4, the first memory layer 402a and the fourth memory layer 402d may be oriented in the first planar orientation, and the second memory layer 402b and the third memory layer 402c may be oriented in the second planar orientation. Alternatively, the first memory layer 402a and the second memory layer 402b may be oriented in the first planar orientation, and the third memory layer 402c and the fourth memory layer 402d may be oriented in the second planar orientation. As another example, the first memory layer 402a may be oriented in the first planar orientation, and the second memory layer 402b, the third memory layer 402c, and the fourth memory layer 402d may be oriented in the second planar configuration.

The memory layers 402 may be in electrical communication with the base substrate (or interface chip) through connectors 412a1, 412b1, 412c2, 412d1. The connectors 412a1, 412b1, 412c2, 412d1 may be connected to electrical contacts, such as electrical pads and/or traces, disposed on the base substrate 416. The base substrate 416 may receive the signals being communicated to and/or from the memory layers 402 by being in electrical communication with a chip, integrated circuit, or other electronic device that may send the signals. For example, the memory chip may be in communication with a field programmable gate array (FPGA) or an application specific gate array (ASIC). Alternatively, the memory chip may be integrated with other components as a single integrated circuit or chip. For example, the memory layers 402 may be integrated with one or more processors as a single chip. The one or more processors may be disposed on a layer of the integrated circuit that is separate from the memory layers 402. Alternatively, one of the layers 402 may include both the individual memory elements and at least one of the processors. The one or more processors may be configured to communicate the signals to the memory layers 402 via the base substrate 416 and/or the interconnect channels 414.

Where the contacts 404 comprise TSVs, as shown in FIG. 4, the TSVs and/or the interconnect channels 414 comprising the TSVs 404 may be manufactured using one or more processes. The processes may include via formation by either deep reactive ion etch or laser drilling, $SiO_2$ deposition, barrier and seed layers deposition, copper plating with tungsten sputtering to fill the vias, and/or CMP (chemical tungsten and mechanical polishing) of copper plating residues. Other processes may be used.

Various embodiments described herein can be used alone or in combination with one another. The foregoing detailed description has described only a few of the many possible implementations of the present invention. For this reason, this detailed description is intended by way of illustration, and not by way of limitation.

We claim:

1. An apparatus comprising:
a stack of a plurality of memory layers comprising:
a first memory layer oriented in a first planar orientation;
a second memory layer oriented in a second planar orientation;
a third memory layer oriented in the first planar orientation; and
a connector that is connected to the first memory layer at an electrical contact of the first memory layer and to the third memory layer at an electrical contact of the third memory layer, and that is unconnected to the second memory layer;
wherein the second planar orientation is angularly offset a predetermined number of degrees from the first planar orientation, and
wherein at least one of the electrical contact of the first memory layer and the electrical contact of the third memory layer comprises a through-layer via.

2. The apparatus claim 1, wherein the second planar orientation is offset from the first planar orientation by about ninety degrees.

3. The apparatus of claim 1, wherein the connector comprises a conductive material, and wherein the conductive material is connected to the electrical contact of the first memory layer and the electrical contact of the third memory layer.

4. The apparatus of claim 1, wherein both the electrical contact of the first memory layer and the electrical contact of the third memory layer comprise through-layer vias.

5. The apparatus of claim 1, wherein one of the electrical contact of the first memory layer and the electrical contact of the third memory layer comprises a pad disposed on a surface of one of the first memory layer and the third memory layer.

6. The apparatus of claim 1, wherein the connector is connected to the electrical contact of the first memory layer at an end portion of the first memory layer, and wherein the connector is connected to the electrical contact of the third memory layer at an end portion of the third memory layer.

7. The apparatus of claim 6, wherein the electrical contact of the first memory layer comprises a first electrical contact of the first memory layer, wherein the electrical contact of the third memory layer comprises a first electrical contact of the third memory layer, wherein the end portion of the first memory layer is a first end portion of the first memory layer, wherein the end portion of the third memory layer is a first end portion of the third memory layer,
wherein the first memory layer further comprises:
a second end portion that is opposite the first end portion of the first memory layer; and
a second electrical contact disposed at the second end portion of the first memory layer;
wherein the third memory layer further comprises:
a second end portion that is opposite the first end portion of the third memory layer; and
a second electrical contact disposed at the second end portion of the third memory layer;
wherein at least one of the second electrical contact of the first memory layer and the second electrical contact of the third memory layer comprises a through-layer via, and
wherein the apparatus further comprises a second connector that is connected to the second electrical contact of the first memory layer and the second electrical contact of the third memory layer, and that is unconnected to the second memory layer.

8. The apparatus of claim 7, wherein both the second electrical contact of the first memory layer and the second electrical contact of the third memory layer comprise a through-layer via.

9. The apparatus of claim 1, further comprising:
a fourth memory layer disposed above the third memory layer, the fourth memory layer oriented in the second planar orientation.

10. The apparatus of claim 9, wherein the connector comprises a first connector, the apparatus further comprising:
a second connector that is connected to an electrical contact of the second memory layer and an electrical contact of the fourth memory layer, and that is,
wherein at least one of the electrical contact of the second memory layer and the electrical contact of the fourth memory layer comprises a through-layer via.

11. The apparatus of claim 10, wherein the second connector is connected to the electrical contact of the second memory layer at an end portion of the second memory layer, and wherein the second connector is connected to the electrical contact of the fourth memory layer at an end portion of the fourth memory layer.

12. The apparatus of claim 10, wherein the electrical contact of the first memory layer is substantially aligned with the electrical contact of the third memory layer, wherein the electrical contact of the second memory layer is substantially aligned with the electrical contact of the fourth memory layer, and wherein the electrical contact of the first memory layer and the electrical contact of the third memory layer are substantially unaligned with the electrical contact of the second memory layer and the electrical contact of the fourth memory layer.

13. The apparatus of claim 1, wherein the second planar orientation is offset from the first planar orientation by about forty-five degrees.

14. The apparatus of claim 1, wherein the at least one through-layer via comprises a through-silicon-via.

15. The apparatus of claim 1, wherein the connector comprises a first connector, and wherein the apparatus further comprises:
a base substrate disposed below the first memory layer;
a second connector that is connected to the electrical contact of the first memory layer and the base substrate, and that is unconnected to the second memory layer; and
a third connector that is connected to an electrical contact of the second memory layer and the base substrate, and that is unconnected to the first memory layer.

16. An apparatus comprising:
a plurality of stacked memory layers comprising:
a first memory layer oriented in a first planar orientation and comprising a first through-layer via;
a second memory layer oriented in a second planar orientation and comprising a second through-layer via;
a third memory layer oriented in the first planar orientation and comprising a third through-layer via;
wherein the second planar orientation is angularly offset from the first planar orientation by a predetermined number of degrees;
wherein the first through-layer via is substantially aligned with the third through-layer via and substantially unaligned with the second through-layer via.

17. The apparatus of claim 16 wherein the first memory layer and the third memory layer are consecutively stacked memory layers.

18. The apparatus of claim 16, wherein the predetermined number of degrees is a first predetermined number of degrees, and wherein the plurality of stacked memory layers further comprises a fourth memory layer oriented in a third planar configuration,
wherein the third planar configuration is angularly offset from the first planar orientation by a second predetermined number of degrees.

19. The apparatus of claim 16, wherein the plurality of stacked memory layers further comprises a fourth memory layer oriented in the first planar orientation.

20. An apparatus comprising:
a plurality of stacked memory layers comprising:
a first set of memory layers oriented in a first planar orientation; and
a second set of memory layers oriented in a second planar orientation;
wherein each memory layer of the plurality of memory layers comprises an end portion that include a plurality of through-layer vias;
wherein the end portions of the first set of memory layers are substantially aligned with each other and are substantially unaligned with the end portions of the second set of memory layers; and
wherein the end portions of the second set of memory layers are substantially aligned with each other and are substantially unaligned with the end portions of the first set of memory layers.

* * * * *